United States Patent
You (10) Patent No.: US 9,627,620 B2
(45) Date of Patent: Apr. 18, 2017

(54) ORGANIC LIGHT-EMITTING DIODE DISPLAY AND METHOD OF MANUFACTURING THE SAME

(71) Applicant: Samsung Display Co., Ltd., Yongin, Gyeonggi-Do (KR)

(72) Inventor: Chungi You, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/738,526

(22) Filed: Jun. 12, 2015

(65) Prior Publication Data
US 2016/0190456 A1 Jun. 30, 2016

(30) Foreign Application Priority Data
Dec. 30, 2014 (KR) ........................ 10-2014-0194322

(51) Int. Cl.
*H01L 51/00* (2006.01)
*H01L 51/56* (2006.01)
*H01L 27/32* (2006.01)
*H01L 51/52* (2006.01)

(52) U.S. Cl.
CPC ...... *H01L 51/0018* (2013.01); *H01L 27/3246* (2013.01); *H01L 27/3262* (2013.01); *H01L 27/3265* (2013.01); *H01L 51/0023* (2013.01); *H01L 51/5203* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,828,726 B2 | 12/2004 | Sakurai et al. | |
| 6,844,215 B1 | 1/2005 | Ghosh | |
| 6,953,951 B2 | 10/2005 | Yamazaki et al. | |
| 7,999,468 B2 | 8/2011 | Lee et al. | |
| 8,106,402 B2 | 1/2012 | Yeo et al. | |

(Continued)

FOREIGN PATENT DOCUMENTS

| | | |
|---|---|---|
| KR | 10-2009-0127715 (A) | 12/2009 |
| KR | 10-2011-0057592 (A) | 6/2011 |

(Continued)

*Primary Examiner* — Joseph Schoenholtz
(74) *Attorney, Agent, or Firm* — Knobbe Martens Olson & Bear LLP (57) ABSTRACT

An organic light-emitting diode (OLED) display and a method of manufacturing the same are disclosed. In one aspect, the method includes performing a first mask process of forming an active layer of a thin-film transistor (TFT) and a first electrode of a capacitor over a substrate and performing a second mask process of i) forming a gate insulating layer and ii) forming a gate electrode of the TFT and a second electrode of the capacitor over the gate insulating layer. The method also includes performing a third mask process of i) forming first and second interlayer insulating layers and ii) removing portions of the first and second interlayer insulating layers so as to form a contact hole that exposes a portion of the active layer. The method also includes performing a fourth mask process of forming a pixel electrode over the second interlayer insulating layer.

16 Claims, 10 Drawing Sheets

(56) References Cited

U.S. PATENT DOCUMENTS

| | | |
|---|---|---|
| 8,203,264 B2 | 6/2012 | Kang et al. |
| 2008/0233665 A1* | 9/2008 | Jung .................. H01L 27/1288 438/23 |
| 2009/0302332 A1 | 12/2009 | Kang et al. |
| 2011/0053301 A1 | 3/2011 | Kang et al. |
| 2011/0121302 A1 | 5/2011 | Lee et al. |
| 2012/0007083 A1* | 1/2012 | You ..................... H01L 27/326 257/59 |
| 2012/0146031 A1 | 6/2012 | Lee |
| 2012/0193624 A1* | 8/2012 | You ..................... H01L 27/124 257/57 |
| 2013/0056710 A1 | 3/2013 | Oh et al. |
| 2013/0119388 A1* | 5/2013 | Lee .................... H01L 51/5265 257/59 |
| 2013/0175533 A1 | 7/2013 | Lee et al. |
| 2013/0335906 A1 | 12/2013 | Shamassian et al. |
| 2016/0141346 A1* | 5/2016 | You ................... H01L 27/3262 257/40 |
| 2016/0190454 A1* | 6/2016 | You ................... H01L 51/0017 257/40 |

FOREIGN PATENT DOCUMENTS

| | | |
|---|---|---|
| KR | 10-2012-0063745 (A) | 6/2012 |
| KR | 10-2013-0080642 (A) | 7/2013 |

\* cited by examiner

ORGANIC LIGHT-EMITTING DIODE DISPLAY AND METHOD OF MANUFACTURING THE SAME

RELATED APPLICATION

This application claims the benefit of Korean Patent Application No. 10-2014-0194322, filed on Dec. 30, 2014, in the Korean Intellectual Property Office, the disclosure of which is incorporated herein in its entirety by reference. This application relates to U.S. patent application entitled "Organic Light-Emitting Diode Display and Method of Manufacturing the Same" (application Ser. No. 14/738,338), which is concurrently filed with this application and incorporated herein by reference in its entirety.

BACKGROUND

Field

The described technology generally relates to an organic light-emitting diode display and a method of manufacturing the same.

Description of the Related Technology

An organic light-emitting diode (OLED) display includes a hole injection electrode, an electron injection electrode, and an emission layer formed therebetween. Holes injected from the hole injection electrode and electrons injected from the electron injection electrode are re-combined in the emission layer so that light is emitted therefrom. The display is considered to be a next generation display due to its favorable characteristics such as low power consumption, high contrast, fast response time, and so forth.

SUMMARY OF CERTAIN INVENTIVE ASPECTS

One inventive aspect relates to an OLED display with reduced defects and manufacturing costs and a method of manufacturing the OLED display.

Another aspect is a method of manufacturing an organic light-emitting display apparatus that includes operations of performing a first mask process for forming an active layer of a thin-film transistor and a first electrode of a capacitor on a substrate; performing a second mask process for forming a gate insulating layer and forming a gate electrode of the thin-film transistor and a second electrode of the capacitor on the gate insulating layer; performing a third mask process for forming a first interlayer insulating layer and a second interlayer insulating layer and forming a contact hole in the first interlayer insulating layer and the second interlayer insulating layer so as to expose a portion of the active layer; performing a fourth mask process for forming a pixel electrode on the second interlayer insulating layer; performing a fifth mask process for forming a source electrode and a drain electrode, wherein one of the source electrode and the drain electrode directly contacts a top surface of the pixel electrode, and the source electrode and the drain electrode are formed by dry etching; and performing a sixth mask process for forming a pixel-defining layer that covers ends of the pixel electrode.

The first mask process can include operations of forming a semiconductor layer on the substrate; forming a first photoresist and a second photoresist having a thickness greater than a thickness of the first photoresist on the semiconductor layer; removing the first photoresist, and performing first doping by using ion impurity; and removing the second photoresist.

The first photoresist and the second photoresist can be formed by using a half-tone mask.

After the operation of removing the second photoresist, the method can further include an operation of performing second doping on a region of the active layer by using ion impurity, wherein the region of the active layer does not overlap with the gate electrode.

The first interlayer insulating layer can be an inorganic layer, and the second interlayer insulating layer can be an organic layer.

The third mask process can include an operation of forming the contact hole by dry etching.

The fifth mask process can include an operation of simultaneously forming the source electrode, the drain electrode, and a pad electrode on a same layer.

The sixth mask process can include an operation of forming the pixel-defining layer such that a thickness of the pixel-defining layer where the pixel-defining layer covers ends of the pad electrode is less than a thickness of the pixel-defining layer where the pixel-defining layer covers the source electrode and the drain electrode.

The sixth mask process can include an operation of forming the pixel-defining layer by using a half-tone mask.

The sixth mask process can include an operation of forming an opening in the pixel-defining layer, and the opening exposes the top surface of the pixel electrode and overlaps with the capacitor.

After the sixth mask process, the method can further include operations of performing a process for forming an emission layer on the pixel electrode; and performing a process for forming an opposite electrode on the emission layer.

The pixel electrode can be a reflective electrode, and the opposite electrode can be a transparent electrode.

The pixel electrode can include silver (Ag) or a silver alloy.

Another aspect is an OLED display that includes a substrate; a thin-film transistor including an active layer, a gate electrode, a source electrode, and a drain electrode that are formed on the substrate; a capacitor including a first electrode formed on a same layer as the active layer, and a second electrode formed on a same layer as the gate electrode; a first interlayer insulating layer formed on the gate electrode and the first electrode; a second interlayer insulating layer formed on the first interlayer insulating layer; a pixel electrode formed at a position overlapping with the capacitor, wherein a bottom surface of the pixel electrode directly contacts a top surface of the second interlayer insulating layer, and a portion of a top surface of the pixel electrode directly contacts a bottom surface of one of the source electrode and the drain electrode; a pixel-defining layer covering ends of the pixel electrode; an emission layer formed on the pixel electrode; and an opposite electrode formed on the emission layer.

The pixel electrode can be a reflective electrode, and the opposite electrode can be a transparent electrode.

The pixel electrode can include silver (Ag) or a silver alloy.

The first interlayer insulating layer can include an inorganic material, and the second interlayer insulating layer can include an organic material.

A first electrode of the capacitor can include a semiconductor doped with ion impurity.

The OLED display can further include a pad electrode that is formed on a same layer as the source electrode and the drain electrode.

A thickness of the pixel-defining layer where the pixel-defining layer covers ends of the pixel electrode can be different from a thickness of the pixel-defining layer where the pixel-defining layer covers ends of the pad electrode.

Another aspect is a method of manufacturing an organic light-emitting diode (OLED) display, the method comprising: performing a first mask process of forming an active layer of a thin-film transistor (TFT) and a first electrode of a capacitor over a substrate; performing a second mask process of i) forming a gate insulating layer and ii) forming a gate electrode of the TFT and a second electrode of the capacitor over the gate insulating layer; performing a third mask process of i) forming first and second interlayer insulating layers and ii) removing portions of the first and second interlayer insulating layers so as to form a contact hole that exposes a portion of the active layer; performing a fourth mask process of forming a pixel electrode over the second interlayer insulating layer; performing a fifth mask process of forming source and drain electrodes via dry etching, wherein one of the source and drain electrodes directly contacts a top surface of the pixel electrode; and performing a sixth mask process of forming a pixel-defining layer at least partially covering ends of the pixel electrode.

In the above method, the first mask process comprises: forming a semiconductor layer over the substrate; forming a first photoresist and a second photoresist having a thickness greater than the thickness of the first photoresist over the semiconductor layer; removing the first photoresist; first doping a region of the active layer with a first ion impurity; and removing the second photoresist.

In the above method, the first and second photoresists are formed via a half-tone mask.

The above method further comprises, after removing the second photoresist, second doping the region of the active layer with a second ion impurity, wherein the region of the active layer does not overlap the gate electrode.

In the above method, the first interlayer insulating layer includes an inorganic layer, wherein the second interlayer insulating layer includes an organic layer.

In the above method, the third mask process comprises forming the contact hole via dry etching.

In the above method, the fifth mask process comprises concurrently forming the source, drain, and pad electrodes on the same layer.

In the above method, the sixth mask process comprises forming the pixel-defining layer such that the thickness of the pixel-defining layer, where the pixel-defining layer covers ends of the pad electrode, is less than the thickness of the pixel-defining layer, where the pixel-defining layer covers the source and drain electrodes.

In the above method, the sixth mask process comprises forming the pixel-defining layer with a half-tone mask.

In the above method, the sixth mask process comprises forming an opening in the pixel-defining layer, wherein the opening exposes the top surface of the pixel electrode and at least partially overlaps the capacitor.

The above method further comprises, after the sixth mask process: forming an emission layer over the pixel electrode; and forming an opposite electrode over the emission layer.

In the above method, the pixel electrode is a reflective electrode, wherein the opposite electrode is a transparent electrode.

In the above method, the pixel electrode is formed of silver (Ag) or a silver alloy.

Another aspect is an organic light-emitting diode (OLED) display comprising: a substrate; a thin-film transistor (TFT) comprising an active layer, a gate electrode, a source electrode, and a drain electrode that are formed over the substrate; a capacitor comprising i) a first electrode formed on the same layer as the active layer and ii) a second electrode formed on the same layer as the gate electrode; a first interlayer insulating layer formed over the gate electrode and the first electrode; a second interlayer insulating layer formed over the first interlayer insulating layer; a pixel electrode formed over the capacitor, wherein a bottom surface of the pixel electrode directly contacts a top surface of the second interlayer insulating layer, and wherein a portion of a top surface of the pixel electrode directly contacts a bottom surface of one of the source and drain electrodes; a pixel-defining layer at least partially covering ends of the pixel electrode; an emission layer formed over the pixel electrode; and an opposite electrode formed over the emission layer.

In the above display, the pixel electrode is a reflective electrode, wherein the opposite electrode is a transparent electrode.

In the above display, the pixel electrode is formed of silver (Ag) or a silver alloy.

In the above display, the first interlayer insulating layer is formed of an inorganic material, wherein the second interlayer insulating layer is formed of an organic material.

In the above display, the first electrode is formed of a semiconductor doped with ion impurity.

The above display further comprises a pad electrode formed on the same layer as the source and drain electrodes.

In the above display, the thickness of the pixel-defining layer, where the pixel-defining layer covers ends of the pixel electrode, is different from the thickness of the pixel-defining layer, where the pixel-defining layer covers ends of the pad electrode.

DETAILED DESCRIPTION OF CERTAIN INVENTIVE EMBODIMENTS

As the described technology allows for various changes and numerous embodiments, particular embodiments will be illustrated in the drawings and described in detail in the written description. Effects and features of the described technology and methods of accomplishing the same can be understood more readily by reference to the following detailed description of exemplary embodiments and the accompanying drawings. The described technology can, however, be embodied in many different forms and should not be construed as being limited to the embodiments set forth herein.

Hereinafter, one or more exemplary embodiments will be described below in more detail with reference to the accompanying drawings. Those components that are the same or are in correspondence are rendered the same reference numeral regardless of the figure number, and redundant explanations are omitted.

Hereinafter, in one or more exemplary embodiments, while such terms as "first," "second," etc., can be used, but such components must not be limited to the above terms, and the above terms are used only to distinguish one component from another.

Hereinafter, in one or more exemplary embodiments, a singular form can include plural forms, unless there is a particular description contrary thereto.

Hereinafter, in one or more exemplary embodiments, terms such as "comprise" or "comprising" are used to specify existence of a recited feature or component, not excluding the existence of one or more other recited features or one or more other components.

Hereinafter, in one or more exemplary embodiments, it will also be understood that when an element such as layer, region, or component is referred to as being "on" another element, it can be directly on the other element, or intervening elements such as layer, region, or component can also be interposed therebetween.

In the drawings, for convenience of description, the sizes of layers and regions are exaggerated for clarity. For example, a size and thickness of each element can be random for convenience of description, thus, one or more exemplary embodiments are not limited thereto.

As used herein, the term "and/or" includes any and all combinations of one or more of the associated listed items. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
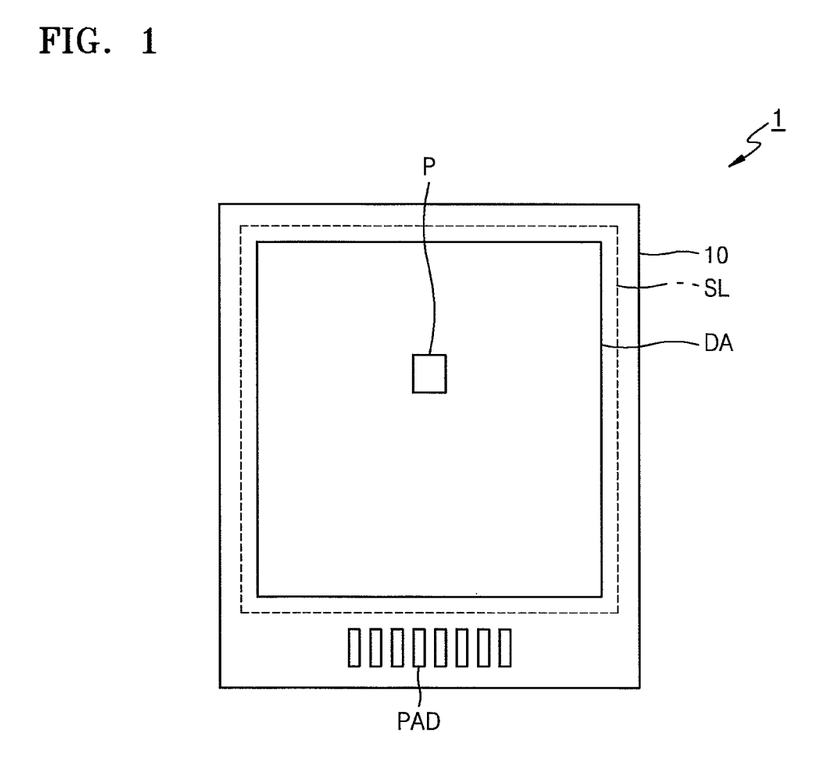
FIG. 1 is a plan view of an OLED display according to a first exemplary embodiment.
Figure 2:
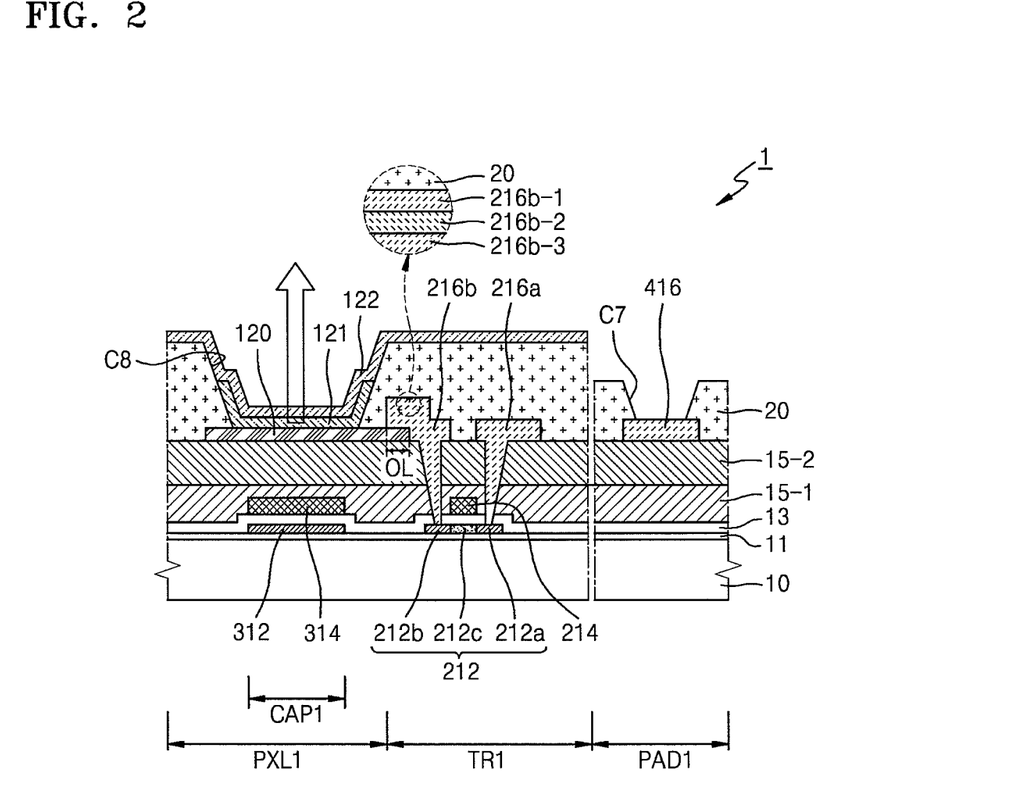
FIG. 2 is a cross-sectional view illustrating a portion of an emission pixel and a portion of a pad of the OLED display according to the first exemplary embodiment.

FIG. 1 is a plan view of an OLED display 1 according to a first exemplary embodiment. FIG. 2 is a cross-sectional view illustrating a portion of an emission pixel and a portion of a pad of the OLED display 1 according to the first exemplary embodiment.

Referring to FIG. 1, the OLED display 1 includes a display area DA on a substrate 10, and the display area DA includes a plurality of pixels P and thus displays an image. The display area DA is formed within a sealing line SL, and an encapsulation member (not shown) is arranged to encapsulate the display area DA along the sealing line SL.

Referring to FIG. 2, a pixel region PXL1 having at least one emission layer 121, a thin-film transistor region TR1 having at least one thin-film transistor, a capacitor region CAP1 having at least one capacitor, and a pad region PAD1 are arranged on the substrate 10.

In the thin-film transistor region TR1, an active layer 212 of the thin-film transistor (TFT) is arranged above the substrate 10 and a buffer layer 11.

The substrate 10 can be formed as a glass substrate or a plastic substrate formed of polyethylene terephthalate (PET), polyethylene naphthalate (PEN), polyimide, or the like.

The buffer layer 11 can be further arranged on the substrate 10 so as to form a planar surface on the substrate 10 and to prevent penetration of foreign substances. The buffer layer 11 can be formed as a single layer or multiple layers formed of silicon nitride and/or silicon oxide.

The active layer 212 is arranged on the buffer layer 11 in the thin-film transistor region TR1. The active layer 212 can be formed of a semiconductor including amorphous silicon or polysilicon. The active layer 212 can include a channel region 212c, and a source region 212a and a drain region 212b that are arranged at both sides of the channel region 212c and are doped with ion impurity. A material of the active layer 212 is not limited to amorphous silicon or polysilicon and can include an oxide semiconductor.

A gate insulating layer 13 is arranged on the active layer 212. The gate insulating layer 13 can be formed as a single layer or multiple layers including silicon nitride and/or silicon oxide.

A gate electrode 214 is arranged on the gate insulating layer 13.

The gate electrode 214 can be formed as a single layer or multiple layers formed of at least one metal material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

Although not illustrated in FIG. 2, a wiring such as a scan line can be formed on the same layer as the gate electrode 214 and formed of the same material as the gate electrode 214. As the screen size of the OLED display 1 increases, the thickness of the wiring increases so as to prevent signal delay due to large wire runs. In some embodiments, the thickness of the gate electrode 214 and the wiring are set in the range of about 6,000 Å to about 12,000 Å. The above range can provide an optimum balance between prevention of signal delays and difficulty of forming thicker layers via deposition. However, depending on the embodiments, the thickness can be less than about 6,000 Å or greater than about 12,000 Å.

A first interlayer insulating layer 15-1 and a second interlayer insulating layer 15-2 are deposited on the gate electrode 214. The first interlayer insulating layer 15-1 can be formed as an inorganic insulating layer, and the second interlayer insulating layer 15-2 can be formed as an organic insulating layer.

In order to prevent the signal delay in the large screen OLED display 1, the thickness of the gate electrode 214 and the wiring are great, and if only the inorganic insulating layer such as the first interlayer insulating layer 15-1 is formed, a crack can occur in the inorganic insulating layer due to the thickness of the wiring. Also, if only the first interlayer insulating layer 15-1 is formed, parasitic capacitance between a wiring formed below the first interlayer insulating layer 15-1 and a wiring formed on the first interlayer insulating layer 15-1 is increased such that a capacitive coupling can occur and thus can prevent exact or accurate signal transmission.

However, in the OLED display 1 according to the present embodiment, even when the thickness of the gate electrode 214 and the wiring is great, since the second interlayer insulating layer 15-2 that is an organic layer is further formed, the crack in the first interlayer insulating layer 15-1 can be prevented, and the parasitic capacitance between the wirings below and on the first interlayer insulating layer 15-1 is decreased so that the exact signal transmission can be maintained.

A source electrode 216a and a drain electrode 216b are arranged on the second interlayer insulating layer 15-2.

The source electrode 216a and the drain electrode 216b can be at least two different metal layers having different electron mobilities. In some embodiments, the source electrode 216a and the drain electrode 216b are formed as at least two different metal layers formed of metal materials selected from Al, Pt, Pd, Ag, Mg, Au, Ni, Nd, Ir, Cr, Li, Ca, Mo, Ti, W, Cu, and an alloy thereof. In some embodiments, the source electrode 216a and the drain electrode 216b includes a first layer 216b-1 formed of Ti, a second layer 216b-2 formed of Al, and a third layer 216b-3 formed of Ti.

The source electrode 216a and the drain electrode 216b that include the first to third layers 216b-1 to 216b-3 can be collectively patterned by dry etching.

A pixel-defining layer 20 that covers the source electrode 216a and the drain electrode 216b is formed over the source electrode 216a and the drain electrode 216b.

The pixel-defining layer 20 can be formed of polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

A pixel electrode 120 contacts one of the source electrode 216a and the drain electrode 216b. Referring to FIG. 2, the pixel electrode 120 directly contacts the drain electrode 216b but one or more embodiments are not limited thereto. That is, the pixel electrode 120 can directly contact the source electrode 216a.

The pixel electrode 120 is arranged on the second interlayer insulating layer 15-2 in the pixel region PXL1.

The pixel electrode 120 functions as a reflective electrode. The pixel electrode 120 can formed of silver (Ag) or a silver alloy.

If the pixel electrode 120 formed of silver (Ag) or the silver alloy, a first transparent conductive oxide layer (not shown) can be further formed between the pixel electrode 120 and the second interlayer insulating layer 15-2 so as to enforce adhesion between the second interlayer insulating layer 15-2 and the pixel electrode 120. A second transparent conductive oxide layer (not shown) can be further formed as a protective layer between the pixel electrode 120 and the emission layer 121 so as to protect the pixel electrode 120.

Each of the first and second transparent conductive oxide layers can be formed of at least one of indium tin oxide (ITO), indium zinc oxide (IZO), zinc oxide (ZnO), indium oxide ($In_2O_3$), indium gallium oxide (IGO), and aluminum zinc oxide (AZO).

A bottom surface of the pixel electrode 120 directly contacts a top surface of the second interlayer insulating layer 15-2.

A portion of an end of the pixel electrode 120 and a portion of the drain electrode 216b directly contact in an overlapping region OL. A bottom surface of the drain electrode 216b directly contacts a top surface of the pixel electrode 120 in the overlapping region OL.

Ends of the pixel electrode 120 are at least partially covered by the pixel-defining layer 20.

An opening C8 for exposing the top surface of the pixel electrode 120 is formed in the pixel-defining layer 20. A thickness of the pixel-defining layer 20 that covers the ends of the pixel electrode 120, the source electrode 216a, and the drain electrode 216b can be in the range of about 50 µm to about 70 µm. However, depending on the embodiments, the thickness of the pixel-defining layer 20 can be less than about 50 µm or greater than about 70 µm.

An intermediate layer (not shown) that includes the emission layer 121 is arranged on the pixel electrode 120 whose top surface is exposed by the opening C8. The emission layer 121 can be formed of a small molecule organic material or a polymer organic material.

If the emission layer 121 is formed of the small molecule organic material, the intermediate layer can further include a hole transport layer (HTL), a hole injection layer (HIL), an electron transport layer (ETL), or an electron injection layer (EIL). In addition to these layers, if required, the intermediate layer can further include various layers.

Here, various organic materials including copper phthalocyanine (CuPc), N,N'-Di(naphthalene-1-yl)-N,N'-diphenyl-benzidine (NPB), tris-8-hydroxyquinoline aluminum) (Alq3), or the like can be used.

If the emission layer 121 includes the polymer organic material, the intermediate layer can further include an HTL. The HTL can be formed of poly-(2,4)-ethylene-dihydroxy thiophene (PEDOT) or polyaniline (PANI).

Here, the polymer organic material can include polyphenylene vinylene (PPV), polyfluorene, or the like. Also, an inorganic material can be further arranged between the emission layer 121 and the pixel electrode 120 and can be further arranged between the emission layer 121 and an opposite electrode 122.

Referring to FIG. 2, the emission layer 121 is formed in the opening C8 but this is only for convenience of description and one or more exemplary embodiments are not limited thereto. The emission layer 121 can be formed not only in the opening C8 but can also extend to a top surface of the pixel-defining layer 20 along an etched surface of the opening C8 formed in the pixel-defining layer 20.

The opposite electrode 122 that is commonly formed in pixels is arranged on the emission layer 121. In the OLED display 1 according to certain embodiments, the pixel electrode 120 is used as an anode and the opposite electrode 122 is used as a cathode but polarities of electrodes can be switched.

The opposite electrode 122 can be a transparent electrode that transmits light emitted from the emission layer 121. Since the pixel electrode 120 is formed as the reflective electrode, and the opposite electrode 122 is formed as the transparent electrode, the light emitted from the emission layer 121 is reflected by the pixel electrode 120, passes through the opposite electrode 122 that is the transparent electrode, and is emitted in an opposite direction of the substrate 10.

The opposite electrode 122 is not separately formed in each pixel but is formed as a common electrode that substantially wholly covers the display area DA (refer to FIG. 1).

The capacitor region CAP1 has a first electrode 312, the gate insulating layer 13 that is a dielectric layer, and a second electrode 314.

The first electrode 312 is formed on the same layer as the active layer 212. The first electrode 312 can be formed of a semiconductor, such as the source region 212a and the drain region 212b of the active layer 212, which is doped with ion impurity.

The second electrode 314 is formed on the same layer as the gate electrode 214. The first electrode 314 can be formed of the same material as the gate electrode 214 and can have the same thickness as the gate electrode 214.

The capacitor region CAP1 having the capacitor overlaps with the pixel region PXL1 having an emission region. Thus, in some embodiments, a separate space for the capacitor region CAP1 is not required, and instead, the pixel region PXL1 can be largely formed, so that an aperture ratio of the OLED display 1 can be increased.

In the pad region PAD1 that is an outer region of the display area DA, a pad electrode 416 that is a connection terminal of an external driver is positioned.

The pad electrode 416 is formed over the second interlayer insulating layer 15-2, and edges of the pad electrode 416 are covered with the pixel-defining layer 20.

The pad electrode 416 can be formed of the same material as the source electrode 216a and the drain electrode 216b.

A thickness of the pixel-defining layer 20 where the pixel-defining layer 20 covers ends of the pad electrode 416 can be less than a thickness of the pixel-defining layer 20 where the pixel-defining layer 20 covers the source electrode 216a, the drain electrode 216b, and the second electrode 314 in the thin-film transistor region TR1 and the capacitor region CAP1.

The pixel-defining layer 20 covers the ends of the pad electrode 416 and thus prevents the ends of the pad electrode 416 from deteriorating. However, if the thickness of the pixel-defining layer 20 is great, when the external driver is connected, a connection error can occur. Therefore, the thickness of the pixel-defining layer 20 where the pixel-defining layer 20 covers the ends of the pad electrode 416 can be less than the thickness of the pixel-defining layer 20 where the pixel-defining layer 20 covers the source electrode 216a and the drain electrode 216.

Although not illustrated in FIG. 2, the OLED display 1 according to the preset embodiment can further include an encapsulation member (not shown) that encapsulates the display area DA including the pixel region PXL1, the capacitor region CAP1, and the thin-film transistor region TR1.

The encapsulation member can be formed as a substrate formed of a glass material, a metal film, or an encapsulation layer indicating an organic insulating layer and an inorganic insulating layer that are alternately formed.

Hereinafter, a method of manufacturing the OLED display 1 will be described with reference to FIGS. 3A through 8.

Figure 3A:
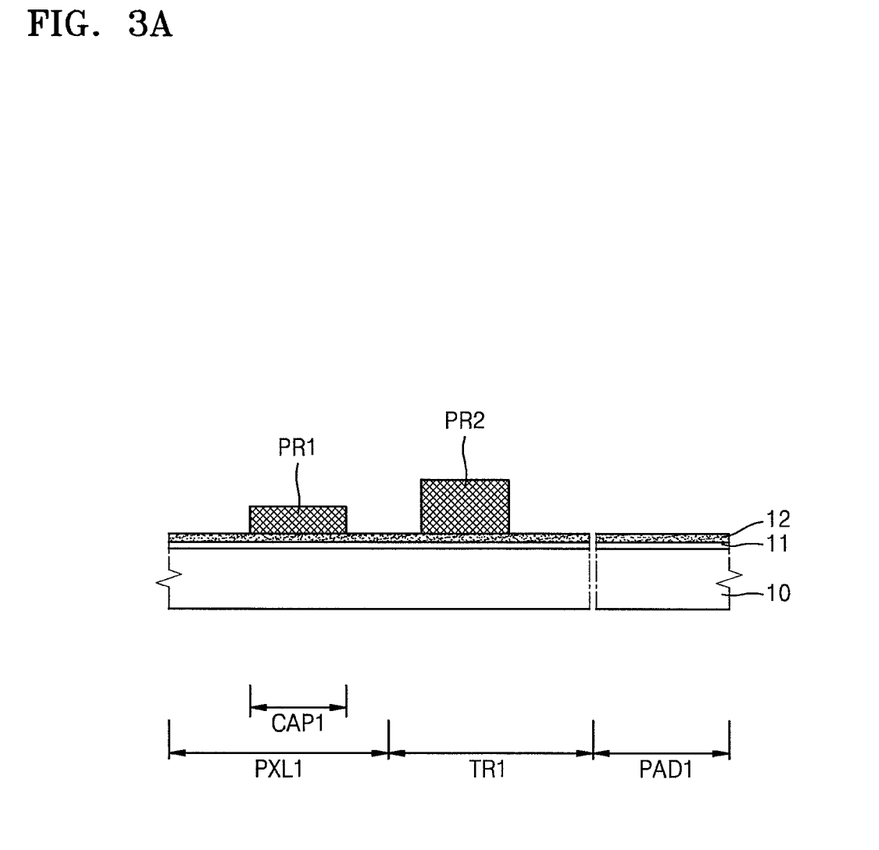
FIGS. 3A through 3C are cross-sectional views illustrating a first mask process for the OLED display, according to a first exemplary embodiment.
Figure 3B:
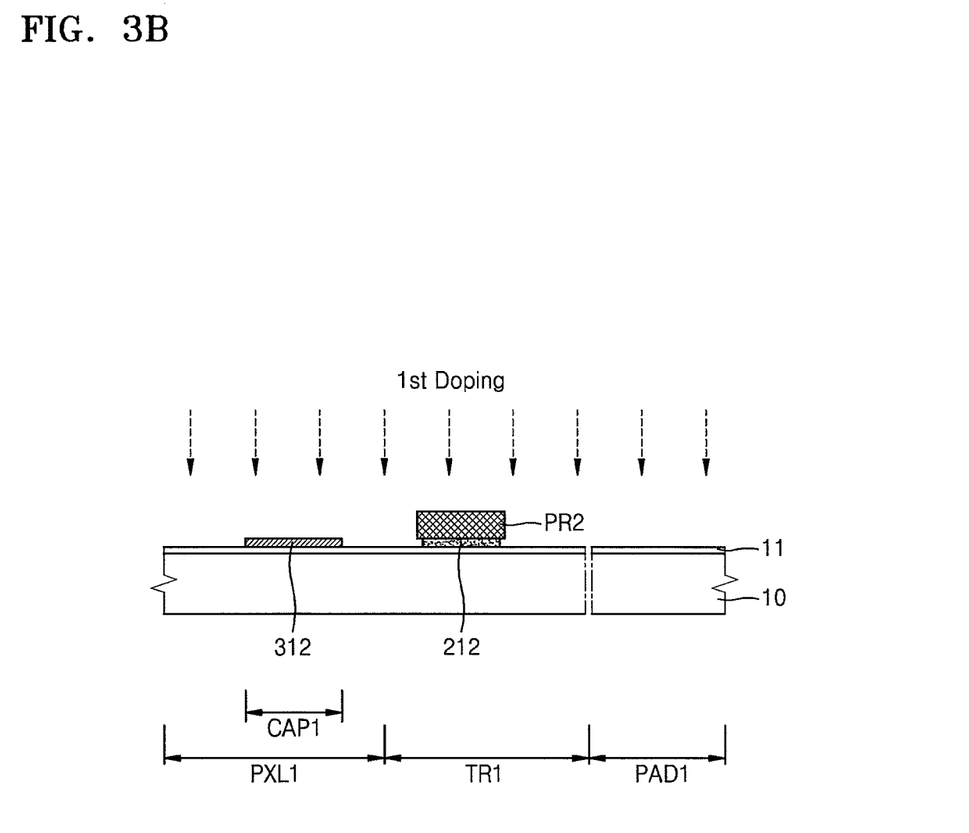
Figure 3C:
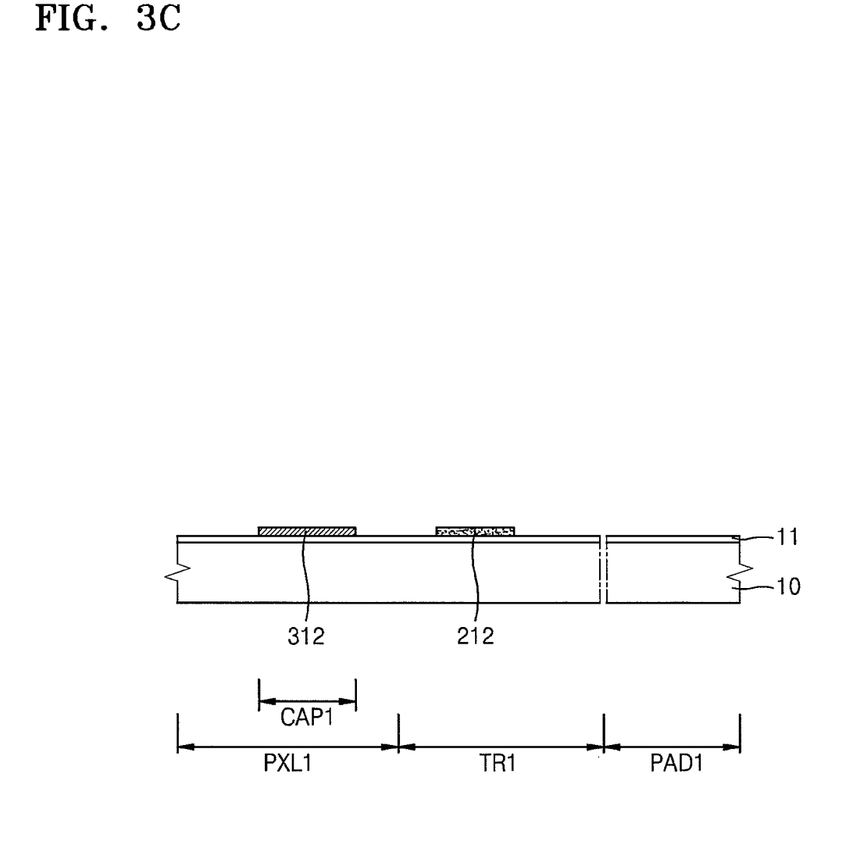

FIGS. 3A through 3C are cross-sectional views illustrating a first mask process for the OLED display 1, according to a first exemplary embodiment.

Referring to FIG. 3A, the buffer layer 11 is formed on the substrate 10, and a semiconductor layer 12 is formed on the buffer layer 11. A photoresist (not shown) is formed on the semiconductor layer 12, and a first photoresist PR1 and a second photoresist PR2 having different thicknesses are formed by using a half-tone mask. The semiconductor layer 12 is etched while the thickness of the second photoresist PR2 is greater than the thickness of the first photoresist PR1.

Referring to FIG. 3B, the first photoresist PR1 is removed, and a first electrode pattern of a capacitor is formed in a region where the first photoresist PR1 was formed. The thickness of the second photoresist PR2 is decreased, and an active layer pattern of a thin-film transistor is formed below the second photoresist PR2.

Ion impurity including b-type ion or p-type ion is first doped on the first electrode pattern of the capacitor and the active layer pattern of the thin-film transistor.

Referring to FIG. 3C, the first electrode pattern of the capacitor is doped with the ion impurity. The second photoresist PR2 that was formed over the active layer pattern of the thin-film transistor is removed.

The semiconductor layer 12 can be formed of amorphous silicon or polysilicon. Here, the polysilicon can be formed by crystallizing the amorphous silicon. The crystallization of the amorphous silicon can be performed by using various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, a material of the semiconductor layer 12 is not limited to the amorphous silicon or the polysilicon and the semiconductor layer 12 can be formed of an oxide semiconductor.

Figure 4:
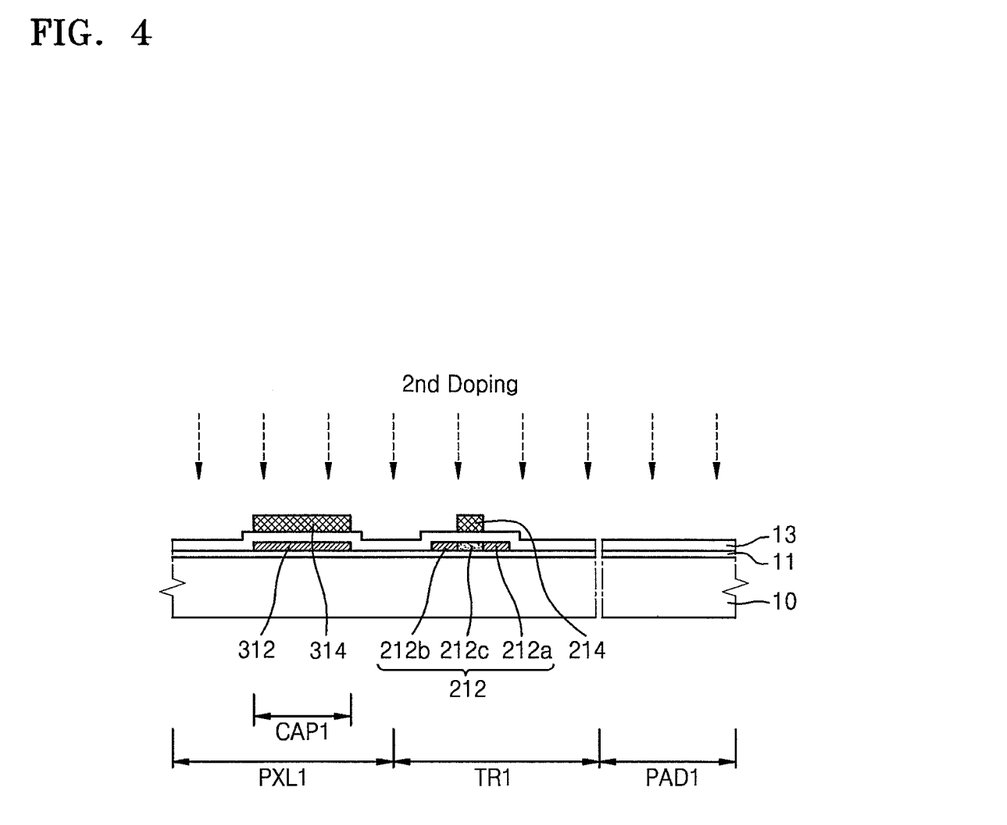
FIG. 4 is a cross-sectional view illustrating a resultant of a second mask process for the OLED display, according to an exemplary embodiment.

FIG. 4 is a cross-sectional view illustrating a resultant of a second mask process for the OLED display 1, according to an exemplary embodiment.

The gate insulating layer 13 is formed on a resultant of the first mask process shown in FIG. 3C, and a first metal layer (not shown) is formed on the gate insulating layer 13 and is patterned.

In some embodiments, the first metal layer is formed as a single layer or multiple layers formed of at least one metal material selected from Al, Pt, Pd, Ag, Mg, Au, Ni, Nd, Ir, Cr, Li, Ca, Mo, Ti, W, and Cu.

As a size of a screen of the OLED display 1 is increased, it is required to increase a thickness of the wiring so as to prevent a signal delay due to the large screen. In some embodiments, a thickness of the gate electrode 214 and the wiring is set in the range of about 6,000 Å to about 12,000 Å. However, depending on the embodiments, the thickness can be less than 6,000 Å or greater than 12,000 Å.

As a patterning result, the gate electrode 214 and the second electrode 314 of the capacitor are formed on the gate insulating layer 13.

Ion impurity is doped on the aforementioned structure. The ion impurity including b-type ion or p-type ion can be doped, and in more detail, the ion impurity with a density of at least $1 \times 10^{15}$ atoms/cm$^2$ is doped while targeting the active layer 212 of the thin-film transistor.

The active layer 212 is doped with the ion impurity by using the gate electrode 214 as a self-align mask, so that the active layer 212 has the source region 212a and the drain region 212b, and the channel region 212c therebetween that are doped with the ion impurity.

Figure 5:
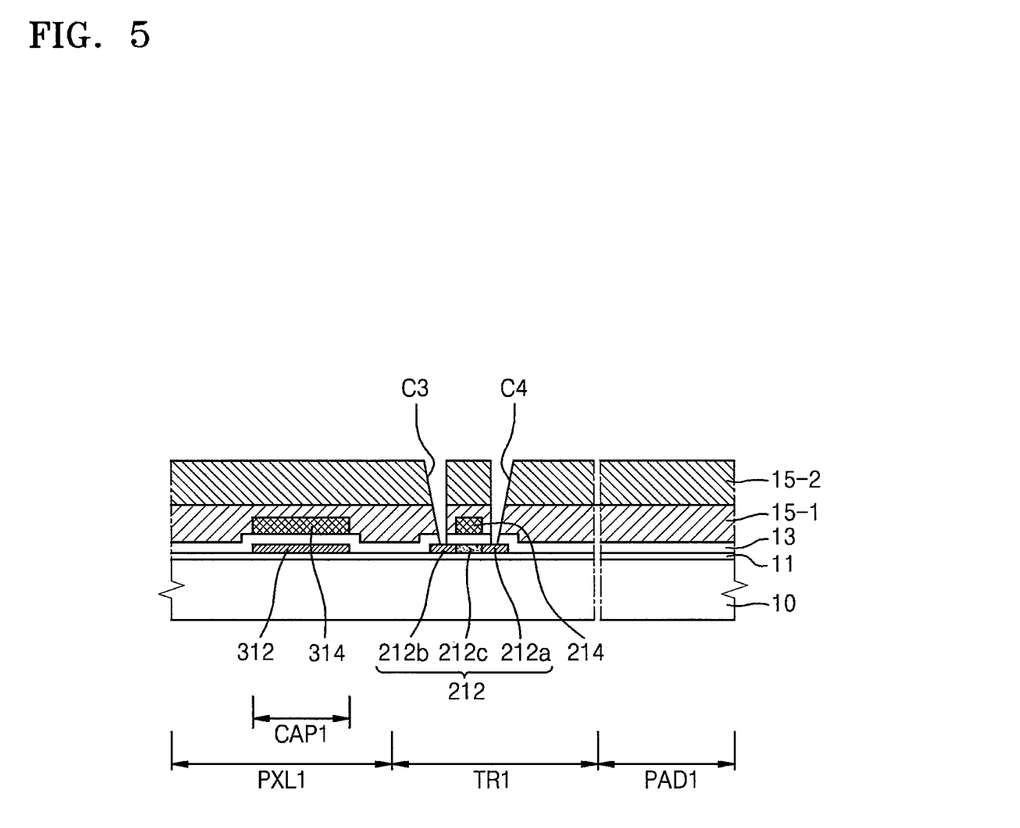
FIG. 5 is a cross-sectional view illustrating a resultant of a third mask process for the OLED display, according to an exemplary embodiment.

FIG. 5 is a cross-sectional view illustrating a resultant of a third mask process for the OLED display 1, according to an exemplary embodiment.

The first interlayer insulating layer 15-1 and the second interlayer insulating layer 15-2 are sequentially formed on a resultant of the second mask process shown in FIG. 4, and are substantially simultaneously or concurrently patterned, so that openings C3 and C4 for exposing the source region 212a and the drain region 212b of the active layer 212 are formed. The openings C3 and C4 can be formed by dry etching the first interlayer insulating layer 15-1 and the second interlayer insulating layer 15-2.

The first interlayer insulating layer 15-1 can be formed as a single layer or multiple layers formed of silicon nitride and/or silicon oxide.

The second interlayer insulating layer 15-2 can be formed of an organic insulating layer formed of at least one selected from polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, and siloxane.

Figure 6:
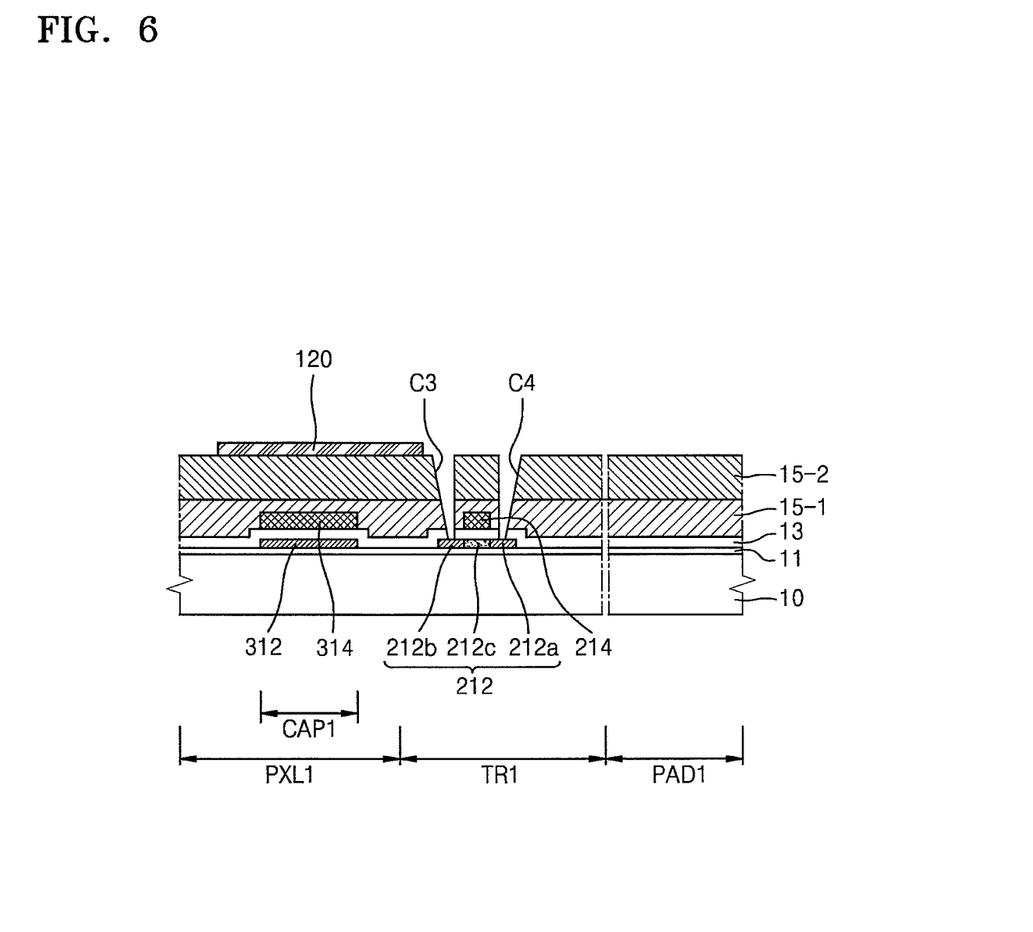
FIG. 6 is a cross-sectional view illustrating a resultant of a fourth mask process for the OLED display, according to an exemplary embodiment.

FIG. 6 is a cross-sectional view illustrating a resultant of a fourth mask process for the OLED display 1, according to an exemplary embodiment.

Referring to FIG. 6, the pixel electrode 120 that is formed of silver (Ag) or a silver alloy is formed on a resultant of the third mask process shown in FIG. 5.

Figure 7:
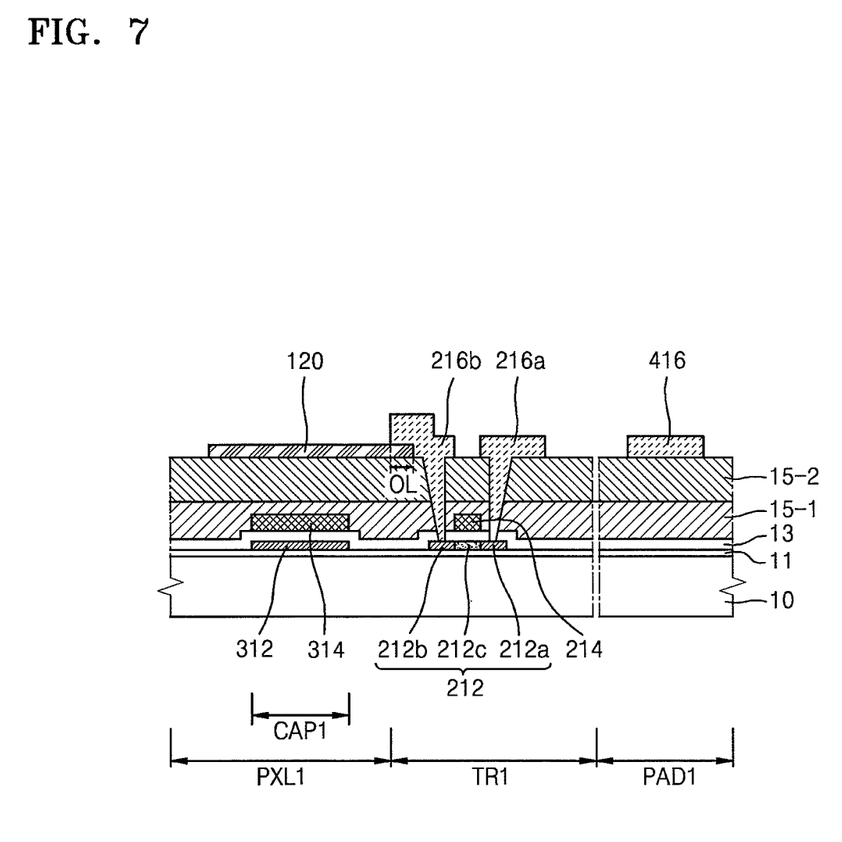
FIG. 7 is a cross-sectional view illustrating a resultant of a fifth mask process for the OLED display, according to an exemplary embodiment.

FIG. 7 is a cross-sectional view illustrating a resultant of a fifth mask process for the OLED display 1, according to an exemplary embodiment.

Referring to FIG. 7, a second metal layer (not shown) is formed on a resultant of the fourth mask process shown in FIG. 6, and is patterned by dry etching such that the source electrode 216a, the drain electrode 216b, and the pad electrode 416 are substantially simultaneously or concurrently formed.

The source electrode 216a, the drain electrode 216b, and the pad electrode 416 are patterned by using the same material during the same mask process.

The second metal layer can be at least two different metal layers having different electron mobilities. For example, the second metal layer is formed as at least two different metal layers formed of metal materials selected from Al, Pt, Pd, Ag, Mg, Au, Ni, Nd, Ir, Cr, Li, Ca, Mo, Ti, W, Cu, and an alloy thereof.

Here, a portion of an end of the pixel electrode 120 and a portion of the drain electrode 216b directly contact in an overlapping region OL. A bottom surface of the drain electrode 216b directly contacts a top surface of the pixel electrode 120 in the overlapping region OL.

If the pixel electrode 120 formed of a metal material such as silver that is highly reducible is first formed prior to forming the source electrode 216a, the drain electrode 216b, the second electrode 314, and the pad electrode 416, and then the source electrode 216a, the drain electrode 216b, the second electrode 314, and the pad electrode 416 are wet etched, silver removed from the pixel electrode 120 is re-extracted as silver particles during wet etching, and one or more particle defects can result. However, in some embodiments, if the source electrode 216a, the drain electrode 216b, the second electrode 314, and the pad electrode 416 are dry etched, a problem due to the re-extraction of the silver particle does not occur. Therefore, a particle defect of the OLED display 1 can be decreased.

Figure 8:
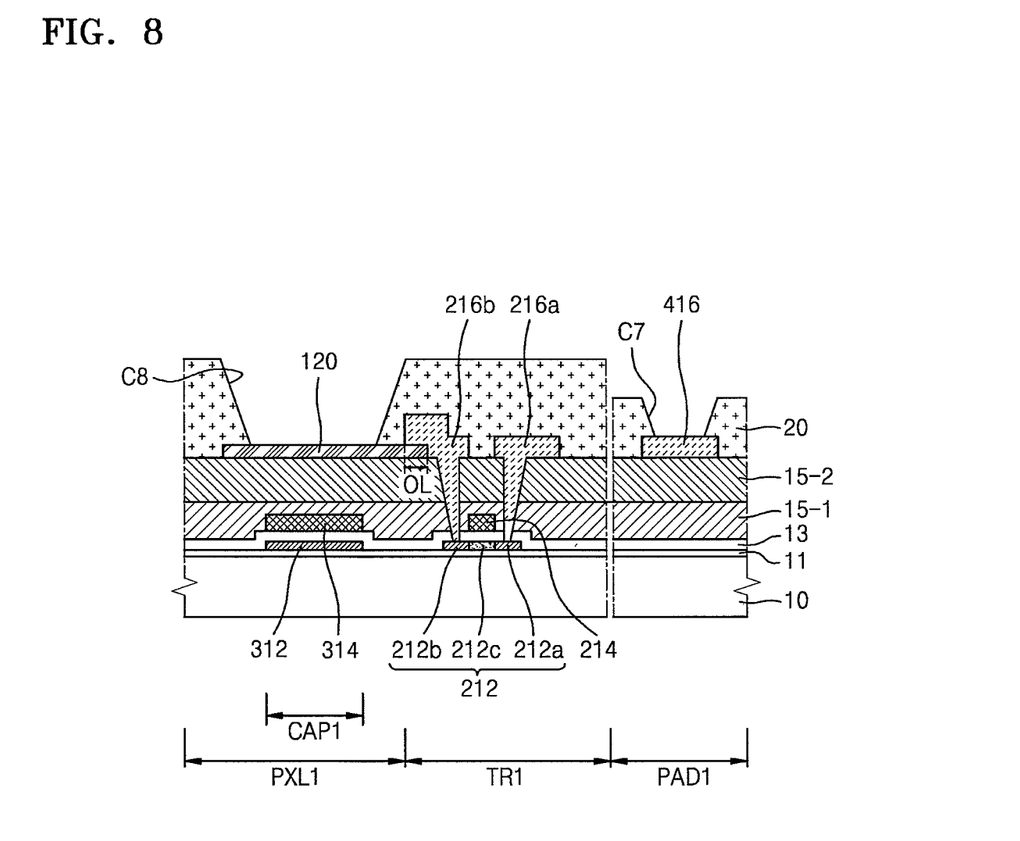
FIG. 8 is a cross-sectional view illustrating a resultant of a sixth mask process for the OLED display, according to an exemplary embodiment.

FIG. 8 is a cross-sectional view illustrating a resultant of a sixth mask process for the OLED display 1, according to an exemplary embodiment.

Referring to FIG. 8, in the sixth mask process, the pixel-defining layer 20 is formed on a resultant of the fifth mask process shown in FIG. 7, and an opening C8 for exposing the pixel electrode 120 and an opening C7 for exposing the pad electrode 416 are formed.

The opening C8 for exposing a top surface of the pixel electrode 120 is formed in a region that overlaps with the capacitor. Thus, in some embodiments, a separate space for the capacitor region CAP1 is not required, and instead, the pixel region PXL1 is largely formed, so that an aperture ratio of the OLED display 1 can be increased.

The pixel-defining layer 20 can include an organic insulating layer formed of polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

A thickness of the pixel-defining layer 20 can be in the range of about 50 µm to about 70 µm. However, depending on the embodiments, the thickness of the pixel-defining layer 20 can be less than about 50 µm or greater than about 70 µm.

By using a half-tone mask (not shown), the thickness of the pixel-defining layer 20 where the pixel-defining layer 20 covers ends of the pad electrode 416 is formed to be less than the thickness of the pixel-defining layer 20 where the pixel-defining layer 20 covers the source electrode 216a and the drain electrode 216b, so that a connection error occurring at the pad electrode 416 while the external driver is connected can be decreased.

An intermediate layer (not shown) that includes the emission layer 121 (refer to FIG. 2) is formed on the resultant of the sixth mask process shown in FIG. 8, and the opposite electrode 122 as a transparent electrode is formed on the emission layer 121.

In the OLED display 1 according to some embodiments, the capacitor and the pixel electrode 120 are formed while overlapping each other, thus, the aperture ratio of the OLED display 1 can be increased.

Also, since an interlayer insulating layer is formed as the first interlayer insulating layer 15-1 that is an inorganic layer and the second interlayer insulating layer 15-2 that is an organic layer, a parasitic capacitance between wirings is decreased so that a quality of signal transmission can be improved.

Also, even if the source electrode 216a and the drain electrode 216b are formed after the pixel electrode 120 is formed, since the source electrode 216a and the drain electrode 216b are patterned by dry etching, re-extraction of silver included in the pixel electrode 120 can be prevented, thereby resulting in a decrease of particle defects.

Also, since the OLED display is manufactured by using the 6 mask processes, manufacturing costs can be reduced.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing an organic light-emitting diode (OLED) display, the method comprising:
    performing a first mask process of forming an active layer of a thin-film transistor (TFT) and a first electrode of a capacitor over a substrate;
    performing a second mask process of i) forming a gate insulating layer and ii) forming a gate electrode of the TFT and a second electrode of the capacitor over the gate insulating layer;
    performing a third mask process of i) forming first and second interlayer insulating layers and ii) removing portions of the first and second interlayer insulating layers so as to form a contact hole that exposes a portion of the active layer;
    performing a fourth mask process of forming a pixel electrode over the second interlayer insulating layer;
    performing a fifth mask process of forming source and drain electrodes via dry etching, wherein one of the source and drain electrodes directly contacts a top surface of the pixel electrode; and performing a sixth mask process of forming a pixel-defining layer at least partially covering ends of the pixel electrode, wherein the first and second electrodes of the capacitor and the pixel electrode overlap each other in the depth dimension of the OLED display.

2. The method of claim 1, wherein the first mask process comprises:
   forming a semiconductor layer over the substrate;
   forming a first photoresist and a second photoresist having a thickness greater than the thickness of the first photoresist over the semiconductor layer;
   removing the first photoresist;
   first doping a region of the active layer with a first ion impurity; and
   removing the second photoresist.

3. The method of claim 2, wherein the first and second photoresists are formed via a half-tone mask.

4. The method of claim 2, further comprising, after removing the second photoresist, second doping the region of the active layer with a second ion impurity, wherein the region of the active layer does not overlap the gate electrode.

5. The method of claim 1, wherein the first interlayer insulating layer includes an inorganic layer, and wherein the second interlayer insulating layer includes an organic layer.

6. The method of claim 1, wherein the third mask process comprises forming the contact hole via dry etching.

7. The method of claim 1, wherein the fifth mask process comprises concurrently forming the source, drain, and pad electrodes on the same layer.

8. The method of claim 7, wherein the sixth mask process comprises forming the pixel-defining layer such that the thickness of the pixel-defining layer, wherein the pixel-defining layer covers ends of the pad electrode, is less than the thickness of the pixel-defining layer, and wherein the pixel-defining layer covers the source and drain electrodes.

9. A method of manufacturing an organic light-emitting diode (OLED) display, the method comprising:
   performing a first mask process of forming an active layer of a thin-film transistor (TFT) and a first electrode of a capacitor over a substrate;
   performing a second mask process of i) forming a gate insulating layer and ii) forming a gate electrode of the TFT and a second electrode of the capacitor over the gate insulating layer;
   performing a third mask process of i) forming first and second interlayer insulating layers and ii) removing portions of the first and second interlayer insulating layers so as to form a contact hole that exposes a portion of the active layer;
   performing a fourth mask process of forming a pixel electrode over the second interlayer insulating layer;
   performing a fifth mask process of forming source and drain electrodes via dry etching, wherein one of the source and drain electrodes directly contacts a top surface of the pixel electrode; and
   performing a sixth mask process of forming a pixel-defining layer at least partially covering ends of the pixel electrode,
   wherein the fifth mask process comprises concurrently forming the source, drain, and pad electrodes on the same layer,
   wherein the sixth mask process comprises forming the pixel-defining layer such that the thickness of the pixel-defining layer, wherein the pixel-defining layer covers ends of the pad electrode, is less than the thickness of the pixel-defining layer, wherein the pixel-defining layer covers the source and drain electrodes, and
   wherein the sixth mask process comprises forming the pixel-defining layer with a half-tone mask.

10. A method of manufacturing an organic light-emitting diode (OLED) display, the method comprising:
   performing a first mask process of forming an active layer of a thin-film transistor (TFT) and a first electrode of a capacitor over a substrate;
   performing a second mask process of i) forming a gate insulating layer and ii) forming a gate electrode of the TFT and a second electrode of the capacitor over the gate insulating layer;
   performing a third mask process of i) forming first and second interlayer insulating layers and ii) removing portions of the first and second interlayer insulating layers so as to form a contact hole that exposes a portion of the active layer;
   performing a fourth mask process of forming a pixel electrode over the second interlayer insulating layer;
   performing a fifth mask process of forming source and drain electrodes via dry etching, wherein one of the source and drain electrodes directly contacts a top surface of the pixel electrode; and
   performing a sixth mask min a pixel-defining layer at least partially covering ends of the pixel electrode,
   wherein the sixth mask process comprises forming an opening in the pixel-defining layer, and wherein the opening exposes the top surface of the pixel electrode and at least partially overlaps the capacitor.

11. The method of claim 1, further comprising, after the sixth mask process:
   forming an emission layer over the pixel electrode; and
   forming an opposite electrode over the emission layer.

12. The method of claim 11, wherein the pixel electrode is a reflective electrode, and wherein the opposite electrode is a transparent electrode.

13. The method of claim 12, wherein the pixel electrode is formed of silver (Ag) or a silver alloy.

14. The method of claim 1, wherein, after the third mask process, the second electrode the capacitor is not exposed.

15. The method of claim 1, wherein the sixth mask process comprises forming the pixel-defining layer such that the thickness of the pixel-defining layer on opposing sides of the pad electrode is less than the thickness of the pixel-defining layer.

16. The method of claim 1, wherein the entirety of each of the first and second electrodes of the capacitor is placed directly below the pixel electrode.

* * * * *